United States Patent
Brill et al.

(10) Patent No.: US 12,146,125 B2
(45) Date of Patent: Nov. 19, 2024

(54) USE OF COMPOSITIONS COMPRISING A SOLVENT MIXTURE FOR AVOIDING PATTERN COLLAPSE WHEN TREATING PATTERNED MATERIALS WITH LINE-SPACE DIMENSIONS OF 50 NM OR BELOW

(71) Applicant: BASF SE, Ludwigshafen am Rhein (DE)

(72) Inventors: Marcel Brill, Ludwigshafen (DE); Daniel Loeffler, Ludwigshafen (DE); Yeni Burk, Ludwigshafen (DE); Frank Pirrung, Ludwigshafen (DE); Lothar Engelbrecht, Berlin (DE); Szilard Csihony, Ludwigshafen (DE); Maike Bergeler, Ludwigshafen (DE); Volodymyr Boyko, Ludwigshafen (DE); Patrick Wilke, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 890 days.

(21) Appl. No.: 17/057,801

(22) PCT Filed: May 13, 2019

(86) PCT No.: PCT/EP2019/062178
§ 371 (c)(1),
(2) Date: Nov. 23, 2020

(87) PCT Pub. No.: WO2019/224032
PCT Pub. Date: Nov. 28, 2019

(65) Prior Publication Data
US 2021/0198602 A1    Jul. 1, 2021

(30) Foreign Application Priority Data
May 25, 2018   (EP) .................... 18174211

(51) Int. Cl.
| | | |
|---|---|---|
| *C11D 7/26* | (2006.01) | |
| *C11D 3/20* | (2006.01) | |
| *C11D 7/50* | (2006.01) | |
| *G03F 7/20* | (2006.01) | |
| *G03F 7/40* | (2006.01) | |
| *G03F 7/42* | (2006.01) | |

(52) U.S. Cl.
CPC .......... *C11D 7/5022* (2013.01); *C11D 3/2006* (2013.01); *C11D 3/201* (2013.01); *C11D 3/2093* (2013.01); *C11D 7/261* (2013.01); *C11D 7/266* (2013.01); *G03F 7/20* (2013.01); *G03F 7/40* (2013.01); *G03F 7/422* (2013.01); *C11D 2111/22* (2024.01)

(58) Field of Classification Search
CPC ..... C11D 3/2093; C11D 3/2006; C11D 3/201; C11D 7/261; C11D 7/266
USPC ......................... 510/175, 176, 505
See application file for complete search history.

(56) References Cited

U.S. PATENT DOCUMENTS

| | | | |
|---|---|---|---|
| 6,569,251 B1 | 5/2003 | Takeda | |
| 7,238,653 B2 | 7/2007 | Lee et al. | |
| 11,042,094 B2 | 6/2021 | Hirano et al. | |
| 2008/0299487 A1 | 12/2008 | Chang | |
| 2011/0314689 A1* | 12/2011 | Okuchi | C11D 11/0047 134/30 |
| 2015/0185619 A1 | 7/2015 | Oikawa et al. | |
| 2017/0170008 A1 | 6/2017 | Park et al. | |

FOREIGN PATENT DOCUMENTS

| | | | | |
|---|---|---|---|---|
| CN | 1530429 A | 9/2004 | | |
| JP | 2011033841 A | 2/2011 | | |
| JP | 2013-257379 A | 12/2013 | | |
| TW | 591348 B | 6/2004 | | |
| TW | 201730327 A | 9/2017 | | |
| WO | WO 2012/027667 A2 | 3/2012 | | |
| WO | WO-2012101545 A1 * | 8/2012 | ........... G03F 7/0046 | |
| WO | WO-2013192534 A1 * | 12/2013 | ............... C11D 1/34 | |
| WO | WO-2014091363 A1 * | 6/2014 | ............. C11D 1/835 | |
| WO | WO-2017057255 A1 * | 4/2017 | | |
| WO | WO-2019105889 A1 * | 6/2019 | ............. C11D 1/004 | |
| WO | WO-2020212173 A1 * | 10/2020 | ......... B81C 1/00928 | |

OTHER PUBLICATIONS

International Search Report issued on Jul. 3, 2019 in PCT/EP2019/062178 filed on May 13, 2019.

* cited by examiner

*Primary Examiner* — Gregory R Delcotto
(74) *Attorney, Agent, or Firm* — Armstrong Teasdale LLP

(57) ABSTRACT

The invention relates to the use of a composition comprising a $C_1$ to $C_6$ alkanol and a carboxylic acid ester of formula (I) wherein $R^1$ is selected from a $C_1$ to $C_6$ alkyl, which may be unsubstituted or substituted by OH or F, and $—X^{21}—[O—X^{22}]_n—H$; $R^2$ is selected from a $C_1$ to $C_6$ alkyl, which may be unsubstituted or substituted by OH or F, and $—X^{21}—[O—X^{22}]_n—H$; $X^{21}$, $X^{22}$ are independently selected from $C_1$ to $C_6$ alkandiyl, which may be unsubstituted or substituted by OH or F; n is an integer from 1 to 5. wherein, the $C_1$ to $C_6$ alkanol and the carboxylic acid ester are selected so as to form an azeotropic mixture and are present in an amount from 20% by weight below to 20% by weight above such azeotropic mixture.

8 Claims, No Drawings

USE OF COMPOSITIONS COMPRISING A SOLVENT MIXTURE FOR AVOIDING PATTERN COLLAPSE WHEN TREATING PATTERNED MATERIALS WITH LINE-SPACE DIMENSIONS OF 50 NM OR BELOW

Use of compositions comprising a solvent mixture for avoiding pattern collapse when treating patterned materials with line-space dimensions of 50 nm or below.

The present invention is directed to the use of a composition for manufacturing integrated circuits devices, optical devices, micromachines and mechanical precision devices, in particular to avoid pattern collapse.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide or silicon nitride layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios.

Irrespective of the exposure techniques the wet chemical processing of small patterns however involves a plurality of problems. As technologies advance and dimension requirements become stricter and stricter, patterns are required to include relatively thin and tall structures or features of device structures i.e., features having a high aspect ratio, on the substrate. These structures may suffer from bending and/or collapsing, in particular, during the spin dry process, due to excessive capillary forces of the liquid or solution of the rinsing liquid deionized water remaining from the chemical rinse and spin dry processes and being disposed between adjacent patterned structures.

In the past, these issues were addressed by reducing) the maximum stress a between small features caused by the capillary forces according to Namatsu et al. Appl. Phys. Lett. 66(20), 1995:

$$\sigma = \frac{6 \cdot \gamma \cdot \cos\theta}{D} \cdot \left(\frac{H}{W}\right)^2$$

wherein γ is the surface tension of the fluid, θ is the contact angle of the fluid on the feature material surface, D is the distance between the features, H is the height of the features, and W is the width of the features. Therefore, to lower the maximum stress, in the past the approaches focused on lowering the surface tension γ of the fluid, or increasing the contact angle of the fluid on the feature material surface, or both.

Due to the shrinkage of the dimensions, the removal of particles and plasma etch residues in order to achieve a defect free patterned structure becomes also a critical factor. This does apply to photoresist patterns but also to other patterned material layers, which are generated during the manufacture of optical devices, micromachines and mechanical precision devices.

WO 2012/027667 A2 discloses a method of modifying a surface of a high aspect ratio feature by contacting the surface of the high aspect ratio feature with an additive composition to produce a modified surface, wherein forces acting on the high aspect ratio feature when a rinse solution is in contact with the modified surface are sufficiently minimized to prevent bending or collapse of the high aspect ratio feature at least during removal of the rinse solution or at least during drying of the high aspect ratio feature. A variety of solvents, including isopropanol, but no esters are mentioned. With 4-methyl-2-pentanol and tripropylene glycol methyl ether (TPGME) or isopropanol and TPGME also combinations of solvents are disclosed.

Unpublished European Patent Application No. 17199807.3 discloses a non-aqueous composition for anti pattern collapse cleaning comprising siloxane-type additives. Preferably, the solvent essentially consists of one or more organic solvents, which may be protic or aprotic organic solvents. Preferred are one or more polar protic organic solvents, most preferred are single polar protic organic solvents like isopropanol.

US 2017/17008 A discloses a pattern treatment composition comprising a polymer comprising a surface attachment group for forming a bond with the surface of the patterned feature and a solvent and a second a pattern treatment composition that is different from the first one. Besides many other combinations, the solvents may be a combination of n-butylacetate and isopropanol.

JP 2013 257379 A discloses solvent based rinsing compositions that use combinations of low fluorine-based, siloxane-based or hydrocarbon-based solvents with other solvents like n-butyl acetate.

However, these compositions still suffer from high pattern collapse in sub 22 nm structures. Especially, without to be bound to any theory, the inventors found that a contact angle in a range from about 70 degrees to about 110 degrees measured with deionized water is not sufficient to describe capillary forces in a solvent based system during drying since the theoretical correlation by Namatsu is only valid in the same solvent system. Furthermore, equation (1) describes only the capillary forces during drying, neglecting potential chemical reactions between collapsing/bending structures during drying and the elastic retraction forces of collapsed structures. Therefore, the inventors believe that pattern collapse can also be prevented by preventing irreversible adhesion between collapsed structures.

It is an object of the present invention to provide a method for manufacturing integrated circuits for nodes of 50 nm and lower, in particular for nodes of 32 nm and lower and, especially, for nodes of 22 nm and lower, which method no longer exhibits the disadvantages of prior art manufacturing methods.

In particular, the compounds according to the present invention shall allow for the chemical rinse of patterned material layers comprising patterns with a high aspect ratio and line-space dimensions of 50 nm and less, in particular, of 32 nm and less, especially, of 22 nm and less, without causing pattern collapse.

SUMMARY OF THE INVENTION

Without being bound to any theory, the invention is based on the finding that focusing on a low surface tension γ of the fluid and a high contact angle θ of the fluid on the feature material surface is an approach which does not work when being faced with feature, which are shirking more and more. Also, the use of particular additives that influence the surface properties of the patterned substrate do not really help to avoid pattern collapse of the patterns on the substrates.

While the prior art focuses on surfactants showing a high contact angle in water and unpublished European Patent Application No. 17199807.3 discloses that the contact angle in water has no or little influence on the ability of a surfactant to reduce pattern collapse, the inventors now found that even without the use of any surfactant and that much higher reduction of pattern collapse is caused by proper selection of the organic solvent.

The present invention completely avoids, all the disadvantages of the prior art by using a composition comprising an alkanol and a carboxylic acid ester that form an azeotropic mixture as described herein.

One embodiment of the present invention is the use of a composition comprising a $C_1$ to $C_6$ alkanol and a carboxylic acid ester of formula I

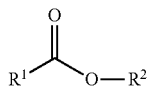

(I)

for treating substrates comprising patterns having line-space dimensions of 50 nm or below and aspect ratios of 4 and more,
wherein
$R^1$ is selected from a $C_1$ to $C_6$ alkyl, which may be unsubstituted or substituted by OH or F, and —$X^{21}$—[O—$X^{22}$]$_n$—H;
$R^2$ is selected from a $C_1$ to $C_6$ alkyl, which may be unsubstituted or substituted by OH or F, and —$X^{21}$—[O—$X^{22}$]$_n$—H;
$X^{21}$, $X^{22}$ are independently selected from $C_1$ to $C_6$ alkandiyl, which may be unsubstituted or substituted by OH or F;
n is an integer from 1 to 5,
wherein the $C_1$ to $C_6$ alkanol and the carboxylic acid ester are selected so as to form an azeotropic mixture and are present in an amount from 20% by weight below to 20% by weight above such azeotropic mixture.

Another embodiment of the present invention is a method for manufacturing integrated circuit devices, optical devices, micromachines and mechanical precision devices, the said method comprising the steps of
(1) providing a substrate having patterned material layers having line-space dimensions of 50 nm and less, aspect ratios of greater or equal 4, or a combination thereof,
(2) contacting the substrate at least once with the composition as defined herein,
and
(3) removing the composition from the contact with the substrate.

The use of these two types of organic solvents is particularly useful for patterned developed photoresist layers comprising patterns having line-space dimensions of 50 nm or less, particularly of 32 nm or less and, most particularly 22 nm or less.

Furthermore, the use of these two types of organic solvents according to the invention is particularly useful for aspect ratios greater or equal 4 without causing pattern collapse.

It has to be noted that the composition according to the present invention are generally useful for avoiding pattern collapse of photoresist structures as well as of non-photoresist patterns with high aspect ratios stacks (HARS).

DETAILED DESCRIPTION OF THE INVENTION

The present invention is directed to a composition particularly suitable for manufacturing patterned materials comprising sub 50 nm sized features like integrated circuit (IC) devices, optical devices, micromachines and mechanical precision devices, in particular IC devices.

Any customary and known substrates used for manufacturing IC devices, optical devices, micromachines and mechanical precision devices can be used in the process of the invention. Preferably, the substrate is a semiconductor substrate, more preferably a silicon wafer, which wafers are customarily used for manufacturing IC devices, in particular IC devices comprising ICs having LSI, VLSI and ULSI.

The composition is particularly suitable for treating substrates having patterned material layers having line-space dimensions of 50 nm and less, in particular, 32 nm and less and, especially, 22 nm and less, i.e. patterned material layers for the sub-22 nm technology nodes. The patterned material layers preferably have aspect ratios above 4, preferably above 5, more preferably above 6, even more preferably above 8, even more preferably above 10, even more preferably above 12, even more preferably above 15, even more preferably above 20. The smaller the line-space dimensions and the higher the aspect ratios are the more advantageous is the use of the composition described herein. The critical aspect ratio also depends on the substrate to be treated for anti pattern collapse. For example, since low-k dielectrics are more unstable and tend to collapse aspect ratios of 4 are already challenging.

The composition according to the present invention may be applied to substrates of any patterned material as long as structures tend to collapse due to their geometry.

By way of example, the patterned material layers may be
(a) patterned silicon layers or silicon oxide or silicon nitride coated Si layers,
(b) patterned barrier material layers containing or consisting of ruthenium, cobalt, titanium nitride, tantalum or tantalum nitride,
(c) patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon, and metals, and
d) patterned dielectric material layers containing or consisting of silicon dioxide or low-k or ultra-low-k dielectric materials.

The composition comprises two types or organic solvents, a $C_1$ to $C_6$ alkanol and a carboxylic acid ester.
Alkanol
The first organic solvent of the composition is a linear or branched $C_1$ to $C_6$ alkanol (also referred to as "alkanol").

Preferably the alkanol is a $C_1$ to $C_5$ alkanol, more preferably a $C_1$ to $C_4$ alkanol, most preferably methanol, ethanol, 1-propanol or 2-propanol. Particularly preferred is 2-propanol.
Ester
The second organic solvent of the composition is a carboxylic acid ester of formula I (also referred to as "ester"):

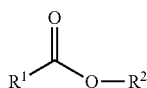

(I)

wherein
- $R^1$ is selected from a linear or branched $C_1$ to $C_6$ alkyl, which may be unsubstituted or substituted by OH or F, and $-X^{21}-[O-X^{22}]_n-H$;
- $R^2$ is selected from a linear or branched $C_1$ to $C_6$ alkyl, which may be unsubstituted or substituted by OH or F, and $-X^{21}-[O-X^{22}]_n-H$;
- $X^{21}$, $X^{22}$ are independently selected from a linear or branched $C_1$ to $C_6$ alkandiyl, which may be unsubstituted or substituted by OH or F;
- n is an integer from 1 to 5.

In a first preferred embodiment $R^1$ is selected from a linear or branched $C_1$ to $C_5$ alkyl, more preferably $C_1$ to $C_4$ alkyl, most preferably methyl, ethyl, 1-propyl or 2-propyl. Such alkyl which may be unsubstituted or substituted by OH or F. $R^2$ is selected from a linear or branched $C_1$ to $C_5$ alkyl, more preferably $C_1$ to $C_4$ alkyl, most preferably methyl, ethyl, 1-propyl or 2-propyl. Such alkyl which may be unsubstituted or substituted by OH or F.

In a second preferred embodiment $R^1$ is selected from a linear or branched $C_1$ to $C_5$ alkyl, more preferably $C_1$ to $C_4$ alkyl, most preferably methyl, ethyl, 1-propyl or 2-propyl. Such alkyl which may be unsubstituted or substituted by OH or F. $R^2$ is $-X^{21}-[O-X^{22}]_n-H$, wherein $X^{21}$, $X^{22}$ are independently selected from a linear or branched $C_1$ to $C_6$ alkandiyl, preferably $C_1$ to $C_5$ alkandiyl, more preferably $C_1$ to $C_4$ alkandiyl, most preferably methanediyl, ethanediyl, propane-1,3-diyl or propane-1,2-diyl; and is an integer from 1 to 5, preferably from 1 to 4, more preferably from 1 to 3, even more preferably 1 or 2, most preferably 1. Such alkanediyl may be unsubstituted or substituted by OH or F.

In a third preferred embodiment $R^1$ is $-X^{21}-[O-X^{22}]_n-H$, wherein $X^{21}$, $X^{22}$ are independently selected from a linear or branched $C_1$ to $C_6$ alkandiyl, preferably $C_1$ to $C_5$ alkandiyl, more preferably $C_1$ to $C_4$ alkandiyl, most preferably methanediyl, ethanediyl, propane-1,3-diyl or propane-1,2-diyl; and is an integer from 1 to 5, preferably from 1 to 4, more preferably from 1 to 3, even more preferably 1 or 2, most preferably 1. Such alkanediyl may be unsubstituted or substituted by OH or F. $R^2$ is selected from a linear or branched $C_1$ to $C_5$ alkyl, more preferably $C_1$ to $C_4$ alkyl, most preferably methyl, ethyl, 1-propyl or 2-propyl.

In a forth preferred embodiment $R^1$ is $-X^{21}-[O-X^{22}]_n-H$, wherein $X^{21}$, $X^{22}$ are independently selected from a linear or branched $C_1$ to $C_6$ alkandiyl, preferably $C_1$ to $C_5$ alkandiyl, more preferably $C_1$ to $C_4$ alkandiyl, most preferably methanediyl, ethanediyl, propane-1,3-diyl or propane-1,2-diyl; and is an integer from 1 to 5, preferably from 1 to 4, more preferably from 1 to 3, even more preferably 1 or 2, most preferably 1. Such alkanediyl may be unsubstituted or substituted by OH or F. $R^2$ is $-X^{21}-[O-X^{22}]_n-H$, wherein $X^{21}$, $X^{22}$ are independently selected from a linear or branched $C_1$ to $C_6$ alkandiyl, preferably $C_1$ to $C_5$ alkandiyl, more preferably $C_1$ to $C_4$ alkandiyl, most preferably methanediyl, ethanediyl, propane-1,3-diyl or propane-1,2-diyl; and is an integer from 1 to 5, preferably from 1 to 4, more preferably from 1 to 3, even more preferably 1 or 2, most preferably 1. Such alkanediyl may be unsubstituted or substituted by OH or F.

Particularly preferred esters are ethyl acetate, methyl acetate, isopropyl acetate and 1-methoxy-2-propyl acetate, also known as propylene glycol monomethylether acetate or PGMEA.

Composition

The alkanol and the ester need to be capable of forming an azeotropic mixture, preferably an azeotropic mixture showing a temperature minimum. Generally, the content of the alkanol in the solvent mixture of the alkanol and the ester preferably is from 20% by weight below to 20% by weight above the azeotropic mixture.

In a preferred embodiment, the content of the alkanol in the solvent mixture of the alkanol and the ester preferably is from 15% by weight below to 15% by weight above the azeotropic mixture. More preferably the content of the alkanol in the solvent mixture of the alkanol and the ester preferably is from 10% by weight below to 10% by weight above the azeotropic mixture. Even more preferred the content of the alkanol in the solvent mixture of the alkanol and the ester preferably is from 8% by weight below to 8% by weight above the azeotropic mixture. Most preferably the content of the alkanol in the solvent mixture of the alkanol and the ester preferably is from 5% by weight below to 5% by weight above the azeotropic mixture.

In a particularly preferred embodiment the anti pattern collapse cleaning (APCC) composition essentially consists of organic solvents, particularly it essentially consists of the alkanol and the carboxylic acid ester.

In another embodiment the composition is a homogeneous (one phase) composition.

If a combination of 2-propanol and ethyl acetate is used the 2-propanol is preferably present in an amount of from 15 to 35% by weight, particularly from 20 to 30% by weight.

Preferably the composition is non-aqueous. As used herein, "non-aqueous" means that the composition may only contain low amounts of water up to about 1% by weight. Preferably the non-aqueous composition comprises less than 0.5% by weight, more preferably less than 0.2% by weight, even more preferably less than 0.1% by weight, even more preferably less than 0.05% by weight, even more preferably less than 0.02% by weight, even more preferably less than 0.01% by weight, even more preferably less than 0.001% by weight. Most preferably essentially no water is present in the composition. "Essentially" here means that the water present in the composition does not have a significant influence on the performance of the additive in the non-aqueous composition with respect to pattern collapse of the substrates to be treated.

Furthermore, it was surprisingly found that in contrast to the use of a single organic solvent and a siloxane-type additive as described in European patent application No. 17199807.3 the composition according to the present invention is highly tolerable with respect to its water content. Therefore, the composition may contain up to 10% by volume of water and a pre-drying of the solvents can be avoided. Preferably the water content may be from 0.5 to 5% by weight.

The solvent mixture should have a boiling point sufficiently low to be removed by heating without negatively impacting the substrate treated with the composition. For typical substrates, the boiling point of the organic solvent should be 150° C. or below, preferably 100° C. or below.

Besides the two organic solvents other organic solvents may be present in amounts up to 10% by weight.

Further additives like surfactants may be present in the compositions in an amount to support the anti pattern collapse characteristics of the composition. Such surfactants may be, but are not limited to those of formulae I to IV in unpublished European patent application No. 17199807.3, which are explicitly incorporated herein by reference.

The content of other compounds should preferably be below 1% by weight, more preferably below 0.5% by weight, even more preferably below 0.1% by weight, most preferably below 0.01% by weight. It is particularly preferred that the compositions, essentially consist of the two organic solvents present in the compositions according to the present invention. As used herein, "Essentially consisting of" means that the content of other components does not influence the anti pattern collapse characteristics of the composition.

In accordance with the method of the invention, the composition comprising the alkanol and the ester may be used for different purposes and objects. Thus, it may be used as an immersion liquid for immersing photoresists during irradiation with actinic light through a mask, as a developer solution for photoresist layers exposed to actinic radiation through a mask and as a chemical rinse composition for rinsing the patterned material layers.

In one embodiment, the method for manufacturing integrated circuit devices, optical devices, micromachines and mechanical precision devices has been found, the method comprising the steps of
(1) providing a substrate having patterned material layers having line-space dimensions of 50 nm and less and aspect ratios of greater or equal 4,
(2) contacting the substrate at least once with a composition comprising the alkanol and the ester as described herein,
and
(3) removing the composition from the contact with the substrate.

In the third step of the method according to the invention, composition is removed from the contact with the substrate. Any known methods customarily used for removing liquids from solid surfaces can be employed.

Preferably the substrate is provided by a photolithographic process comprising the steps of
(i) providing the substrate with an immersion photoresist, EUV photoresist or eBeam photoresist layer,
(ii) exposing the photoresist layer to actinic radiation through a mask with or without an immersion liquid,
(iii) developing the exposed photoresist layer with a developer solution to obtain a pattern having line-space dimensions of 32 nm and less and an aspect ratio of 4 or more,
(iv) applying the composition described herein to the developed patterned photoresist layer, and
(v) spin drying the semiconductor substrate after the application of the composition.

Any customary and known immersion photoresist, EUV photoresist or eBeam photoresist can be used. The immersion photoresist may already contain at least one of the siloxane additives or a combination thereof. Additionally, the immersion photoresist may contain other nonionic additives. Suitable nonionic additives are described, for example, in US 2008/0299487 A1, page 6, paragraph [0078]. Most preferably, the immersion photoresist is a positive resist.

Beside e-Beam exposure or extreme ultraviolet radiation of approx. 13.5 nm, preferably, UV radiation of the wavelength of 193 nm is used as the actinic radiation.

In case of immersion lithography preferably, ultra-pure water is used as the immersion liquid.

Any customary and known developer solution can be used for developing the exposed photoresist layer. Preferably, aqueous developer solutions containing tetramethylammonium hydroxide (TMAH) are used.

Preferably, the chemical rinse compositions are applied to the exposed and developed photoresist layers as puddles.

It is essential for photolithographic process according to the method of the invention, that the chemical rinse composition contains the alcohol and the ester in combination.

Customary and known equipment customarily used in the semiconductor industry can be used for carrying out the photolithographic process in accordance with the method of the invention.

EXAMPLES

Patterned silicon wafers with a circular nano pillar pattern were used to determine the pattern collapse performance of the formulations during drying. The (aspect ratio) AR 20 pillars used for testing had a height of 600 nm and a diameter of 30 nm. The pitch size was 90 nm. 1×1 cm wafer pieces where processed in the following sequence without drying in between:
50 s Dilute Hydrofluoric Acid (DHF) 0.9% dip,
60 s ultra-pure water (UPW) dip,
30 s 2-propanol (isopropanol, IPA) dip,
60 s dip with a composition consisting 2-propanol in an amount specified in table 1 and ethyl acetate at room temperature,
60 s IPA dip,
$N_2$ blow dry.

The dried silicon wafers where analyzed with top down SEM and the collapse statistics for the examples are shown in Tables 1 to 4. Since the collapse varies from center to edge only structures taken from essentially the same center edge distance were compared.

The pattern collapse Cluster Size Distribution was determined from the SEM images. The cluster size corresponds to number of uncollapsed pillars the respective cluster consist of. By way of example, if the wafer before treatment comprises 4×4 pillars and 8 remain uncollapsed, 4 collapsed into two clusters comprising 2 pillars and 4 pillars collapse into one cluster comprising 4 pillars the ratio would be 8/11 single clusters, 2/11 double clusters and 1/11 clusters with four pillars. The more single (1) clusters are present, the better is the performance of the anti pattern collapse treatment. The more 3 or 4 or even >5 clusters are present the worse is the effect of treatment.

TABLE 1

| Example | 2-propanol [mass %] | Cluster Size Distribution in collapsed structures [%] | | | |
| --- | --- | --- | --- | --- | --- |
| | | 1 | 2 | 3 or 4 | >5 |
| 1 (comp.) | 100 | 46.2 | 20.8 | 32.8 | 0.3 |
| 3 | 30 | 99.1 | 0.9 | 0.0 | 0.0 |
| 4 | 25 | 99.9 | 0.1 | 0.0 | 0.0 |
| 5 | 20 | 99.4 | 0.6 | 0.0 | 0.0 |
| 6 | 15 | 69.6 | 3.7 | 36.2 | 0.5 |

Table 1 shows that compositions 3 to 6 show a beneficial effect on the degree of pattern collapse compared to the composition with 2-propanol only. Particularly the compositions close to the azeotropic mixture with 20 to 30% by weight of 2-propanol and 70 to 80% by weight of ethyl acetate show essentially no collapse at all.

TABLE 2

| Example | 2-propanol [mass %] | Cluster Size Distribution in collapsed structures [%] | | | |
|---|---|---|---|---|---|
| | | 1 | 2 | 3 or 4 | >5 |
| 7 (comp.) | 100 | 62.1 | 12.8 | 24.8 | 0.3 |
| 8 (comp) | 0 | 42.2 | 8.1 | 49.2 | 0.5 |
| 9 | 25 | 100.0 | 0.0 | 0.0 | 0.0 |

The results of experiments 7 to 8 depicted in Table 2 show that the combination of the claimed solvents show a dramatic effect on the anti pattern collapse compared to the singles solvents.

TABLE 3

| Example | 2-propanol [mass %] | Cluster Size Distribution in collapsed structures [%] | | | |
|---|---|---|---|---|---|
| | | 1 | 2 | 3 or 4 | >5 |
| 10 (comp.) | 100 | 32.5 | 20.2 | 47.0 | 0.3 |
| 11 (comp) | 90* | 26.7 | 17.6 | 55.4 | 0.3 |
| 12 | 25* | 99.9 | 0.1 | 0.0 | 0.0 |

*azeotropic mixture is approx. 25% by weight of 2-propanol

The results of experiments 10 to 12 depicted in Table 3 show that high amounts of 2-propanol have no positive effect on the anti pattern collapse treatment in contrast to the claimed amounts.

TABLE 4

| Example | H2O [mass %] | 2-propanol [mass %] | Cluster Size Distribution in collapsed structures [%] | | | |
|---|---|---|---|---|---|---|
| | | | 1 | 2 | 3 or 4 | >5 |
| 13 (comp.) | | 100 | 32.5 | 20.2 | 47.0 | 0.3 |
| 14 | | 25 | 99.9 | 0.05 | 0.05 | 0.0 |
| 15 | 0.1 | 24.95 | 99.9 | 0.05 | 0.05 | 0.0 |
| 16 | 1 | 24.5 | 99.9 | 0.05 | 0.05 | 0.0 |
| 17 | 10 | 20 | 99.8 | 0.2 | 0.0 | 0.0 |

The results of experiments 13 to 17 depicted in Table 4 show that surprisingly, and in contrast to the use of a single solvent in combination with additives like the siloxane-type surfactants described in unpublished European Patent Application No. 17199807.3, the solvent mixture is extremely tolerant with respect to its content of water. Even an amount of 10% of water shows only a minor effect on the anti pattern collapse performance of the composition. Extensive drying of the solvents can be omitted in this way.

The invention claimed is:

1. A method of treating a substrate comprising a pattern having line-space dimensions of 50 nm or less and an aspect ratio of 4 or more, the method comprising contacting the substrate with a composition comprising 20 to 30% by weight of 2-propanol and 70 to 80% by weight of ethyl acetate.

2. The method of claim 1, wherein the composition consists essentially of 2-propanol and ethyl acetate.

3. A method for manufacturing an integrated circuit device, an optical device, a micromachine and/or a mechanical precision device, the method comprising:
    (1) providing a substrate comprising a patterned material layer having line-space dimensions of 50 nm or less, an aspect ratio of 4 or more, or a combination thereof;
    (2) contacting the substrate at least once with a rinsing composition; and
    (3) removing the rinsing composition from the contact with the substrate,
    wherein the rinsing composition comprises 20 to 30% by weight of 2-propanol and 70 to 80% by weight of ethyl acetate.

4. The method of claim 3, wherein the patterned material layer has line-space dimensions of 32 nm or less and an aspect ratio of 4 or more.

5. The method of claim 2, wherein the patterned material layer is selected from the group consisting of a patterned developed photoresist layer, a patterned barrier material layer, a patterned multi-stack material layer and a patterned dielectric material layer.

6. The method of claim 3, wherein the substrate is provided by a photolithographic process comprising:
    (i) providing a substrate with an immersion photoresist, EUV photoresist or eBeam photoresist layer;
    (ii) exposing the photoresist layer to actinic radiation through a mask with or without an immersion liquid, to obtain an exposed photoresist layer; and
    (iii) developing the exposed photoresist layer with a developer solution, to obtain a pattern having line-space dimensions of 50 nm or less and an aspect ratio of 4 or more.

7. The method of claim 1, wherein the composition further comprises water in an amount up to 10% by weight.

8. The method of claim 3, wherein the composition further comprises water in an amount up to 10% by weight.

* * * * *